(12) United States Patent
Meyer et al.

(10) Patent No.: US 9,576,918 B2
(45) Date of Patent: Feb. 21, 2017

(54) CONDUCTIVE PATHS THROUGH DIELECTRIC WITH A HIGH ASPECT RATIO FOR SEMICONDUCTOR DEVICES

(71) Applicant: INTEL IP CORPORATION, Santa Clara, CA (US)

(72) Inventors: Thorsten Meyer, Regensburg (DE); Andreas Wolter, Regensburg (DE)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 14/717,169

(22) Filed: May 20, 2015

(65) Prior Publication Data

US 2016/0343677 A1 Nov. 24, 2016

(51) Int. Cl.
*H01L 21/44* (2006.01)
*H01L 23/00* (2006.01)
(Continued)

(52) U.S. Cl.
CPC ............. *H01L 24/05* (2013.01); *H01L 21/565* (2013.01); *H01L 21/568* (2013.01); *H01L 21/6836* (2013.01); *H01L 21/78* (2013.01); *H01L 23/49816* (2013.01); *H01L 23/49838* (2013.01); *H01L 23/5226* (2013.01); *H01L 24/03* (2013.01); *H01L 24/06* (2013.01); *H01L 24/13* (2013.01); *H01L 2224/02372* (2013.01); *H01L 2224/03462* (2013.01); *H01L 2224/0401* (2013.01); *H01L 2224/05009* (2013.01);
(Continued)

(58) Field of Classification Search
CPC ...... H01L 24/05; H01L 21/78; H01L 21/6836; H01L 21/565; H01L 21/568; H01L 24/03; H01L 24/06; H01L 24/13; H01L 23/49816; H01L 23/5226; H01L 23/49838
See application file for complete search history.

(56) References Cited

U.S. PATENT DOCUMENTS

| | | | |
|---|---|---|---|
| 6,016,013 A | 1/2000 | Baba | |
| 2004/0115868 A1* | 6/2004 | Ono | H01L 23/3114 438/127 |

(Continued)

FOREIGN PATENT DOCUMENTS

| | | |
|---|---|---|
| JP | 2004-165234 | 6/2004 |
| JP | 2005-175320 | 6/2005 |

OTHER PUBLICATIONS

PCT International Search Report and Written Opinion of the International Searching Authority for International Application No. PCT/US2016/028305, dated Jul. 26, 2016, 11 pages.

*Primary Examiner* — Long Pham
(74) *Attorney, Agent, or Firm* — Blakely, Sokoloff, Taylor & Zafman LLP

(57) ABSTRACT

Conductive paths through a dielectric are described that have a high aspect ratio for semiconductor devices. In one example, a plurality of conductive connection pads are formed on a semiconductor substrate to connect to circuitry formed on the substrate. A post is formed on each of a subset of the connection pads, the posts being formed of a conductive material. A dielectric layer is formed over the semiconductor substrate including over the connection pads and the posts. Holes are formed by removing the dielectric layer directly over the posts. The formed holes are filled with a conductive material and a connector is formed over each filled hole.

17 Claims, 4 Drawing Sheets

(51) Int. Cl.
*H01L 21/78* (2006.01)
*H01L 21/683* (2006.01)
*H01L 21/56* (2006.01)
*H01L 23/498* (2006.01)
*H01L 23/522* (2006.01)

(52) U.S. Cl.
CPC ........... *H01L 2224/05076* (2013.01); *H01L 2224/05147* (2013.01); *H01L 2224/06051* (2013.01); *H01L 2224/13014* (2013.01); *H01L 2224/13026* (2013.01); *H01L 2924/014* (2013.01)

(56) References Cited

U.S. PATENT DOCUMENTS

2006/0050753 A1* 3/2006 Ogura ................... B82Y 10/00
　　　　　　　　　　　　　　　　　　　　　372/43.01
2006/0163722 A1 7/2006 Hsu
2015/0014851 A1 1/2015 Lu et al.

* cited by examiner

CONDUCTIVE PATHS THROUGH DIELECTRIC WITH A HIGH ASPECT RATIO FOR SEMICONDUCTOR DEVICES

FIELD

The present description relates to forming conductive paths through a dielectric on a semiconductor device and in particular to such a path formed using a conductive post.

BACKGROUND

Semiconductor and micromechanical dies or chips are frequently packaged for protection against an external environment. The package provides physical protection, stability, external connections, and in some cases, cooling to the die inside the packages. Typically the die is attached to a substrate and then a cover that attaches to the substrate is placed over the die. Alternatively, the die is attached to a cover and then a package substrate or redistribution layer is formed on the die. In some cases a die cover extends laterally past the die area and the redistribution layer is applied to the die area and the lateral extension to form a fan-out package.

Wafer Level Ball Grid Array (WLB) packages and other packages often use a dielectric layer between the chip surface and the redistribution layers. The dielectric layer mechanically protects the die surface and functions as a stress buffer. This helps to ensure that stresses from a printed circuit board do not damage the package or the package connections to the board. The dielectric layer also defines a gap or distance between the functional metal structures of the die and the redistribution layers that connect to the board. This gap improves electrical performance, by limiting capacitive coupling between the RDL and the die surface. In addition, a defined gap between the RDL and the chip surface allows transmission lines to be built between the two with a well-defined line impedance. Other types of packages use a dielectric layer between the chip surface and package substrate.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
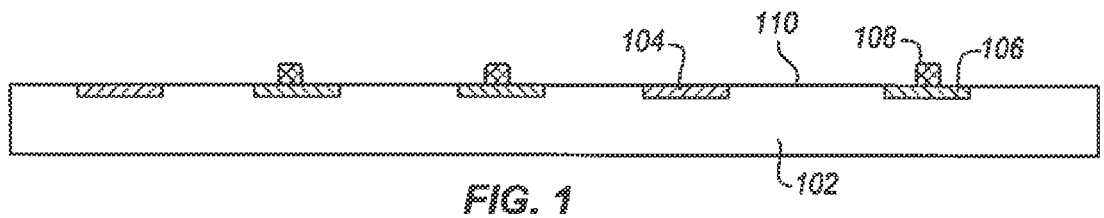
FIG. 1 is a cross-sectional side view diagram of a portion of a die with conductive pads with posts according to an embodiment.

The thickness of the dielectric layer between a die and the RDL or package substrate directly relates to mechanical strength and RF performance. If the dielectric is made thinner, then the RF performance of the package may be reduced by the capacitive coupling between the pad or redistribution metallization layers and the die. To achieve a specific line impedance using a dielectric with a reduced thickness, the line width would also need to be reduced. Often this is not possible because of fabrication limitations. Also with small dielectric thicknesses and reduced line widths, the relative tolerances of width, thickness and impedance are more difficult to control. At the same time, larger metal structures for power and ground contacts are desired. Current fabrication methods require corresponding thicker dielectric layers for such power and ground contacts. The diameters of plated or filled openings in the dielectric materials typically used for WLB are determined by the thickness of the dielectric layer. Conventionally, a higher dielectric thickness requires a larger opening. This is because the aspect ratio between the diameter of the opening and the depth of the via is restricted for photolithography by the photo-imageable component of the dielectric or for laser drilling by the capability of the laser. The larger metal structures, on the other hand, have increased capacitive coupling that reduces the RF performance of package.

An important contribution to the capacitive coupling between structures within the RDL stack and between such structures and the die comes from the vias and from the die pads and the RDL pads connected by these vias. Very small vias produce less capacitive coupling. Furthermore smaller via diameters allow for smaller pad diameters on the die and within the RDL. Smaller pads further reduce capacitive coupling. Reduced via and pad dimensions also allow for an increased wiring density. For signal connections, a smaller via may be used. On the other hand, a certain current carrying capability is often used for power and ground connections. These vias may be larger and may be referred to herein as having standard pad dimensions and via diameters.

The depth of the vias may be reduced without affecting the thickness of the dielectric layer by the application of a post to a die pad or other pad surface. The post allows a via between a pad on the die to a pad on the RDL to be very small because the via only extends between the post and the RDL pad. This is a shallower depth at the positions of the posts. At the same time, for power and ground connections, large vias, without posts or with very short posts may be made on larger pads for higher current capacity. The thick dielectric and the narrow vias improve RF-performance for WLB packages of both fan-in and fan-out types and for other packages.

As described herein posts may be used only for those vias which will have the small diameter or posts may be used for all pads or for some pads of different types. The posts on small pads allow the via to maintain a suitable aspect ratio by reducing the depth of the via. Other vias with larger diameter and greater dielectric thickness can be fabricated in parallel with the same aspect ratio by omitting the post. The larger vias may be used for power and for ground connections, among others. Because of the post, the depth required of the via is much less. The post allows a constant aspect ratio to be maintained for small and large via diameters. This improves manufacturability. The large vias may also be fabricated using posts. However, care is taken to ensure that the mechanical stress of the posts acting on the die pads does not damage the die pads.

FIG. 1 is a cross-sectional side view diagram of a portion of a semiconductor die 102 that has been formed on a wafer. The wafer will contain many more dies although only a portion of a single die is shown for simplicity. The die 102 contains any desired type of logic, RF, power, or optical circuitry (not shown) or some combination thereof. The front side 110 of the die has connection pads 104, 106 of different sizes. The size of each connection pad may be determined by the amount of current that the connection pad must carry but may also be determined by other factors as well, such as connections within the circuitry of the die. The back side of the die is a part of the wafer (not shown).

A post 108 is formed on each of the small pads. The posts are formed of a conductive material such as copper or nickel but any other suitable electrically conductive material may be used. In one example, a protective layer like TiN is applied to the surface of the chip pads. A seed layer is then formed over the full wafer surface. A photoresist layer is then applied and patterned to expose the small pads and the posts are formed by electroplating. After the photoresist is removed, the seed layer is etched off and the structure of FIG. 1 remains. The post diameter may be chosen to be small enough so that the post is located completely within the pad. This leads to the pad being partially exposed when the seed layer and photoresist are etched off. Therefore a protective layer is applied to prevent damage to the pad. In the final stack, the protective layer separates the post from the die pad. Therefore the protective layer is selected to be conductive.

Figure 2:
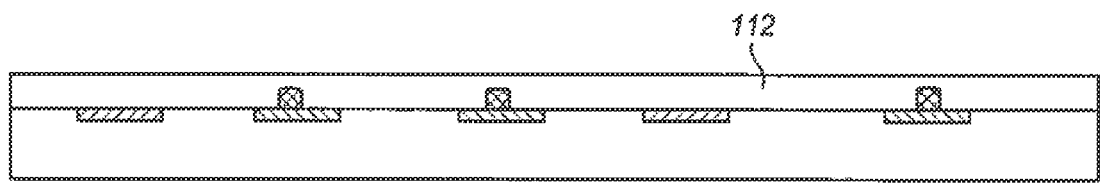
FIG. 2 is a cross-sectional side view diagram of the portion of the die of FIG. 1 with a dielectric layer applied according to an embodiment.

FIG. 2 is a cross-sectional side view diagram of the portion of the die of FIG. 1 after a dielectric layer 112 has been applied over the pads and the posts. The dielectric layer protects the die surface mechanically and functions as a stress buffer between the die and the board. The dielectric layer also defines a gap between the functional metal structures of the die (not shown) which are within the circuitry formed on the front side of the die and the redistribution layers shown in FIG. 4. The dielectric layer also defines the distance between redistribution layers and the die substrate. Therefore a certain minimum thickness of the dielectric may be used.

If the thickness of the dielectric layer were reduced then package performance would be affected. First, the dielectric layer would be less able to buffer mechanical stress which would reduce board level reliability. For WLB and eWLB packages, the dielectric layer is used as a structural component so the weaker dielectric layer may allow catastrophic failure. Second, the distance between the redistribution layer and the metal structures of the die or the die substrate would be reduced which would lead to reduced electrical performance for the package especially at higher frequencies.

Figure 3:
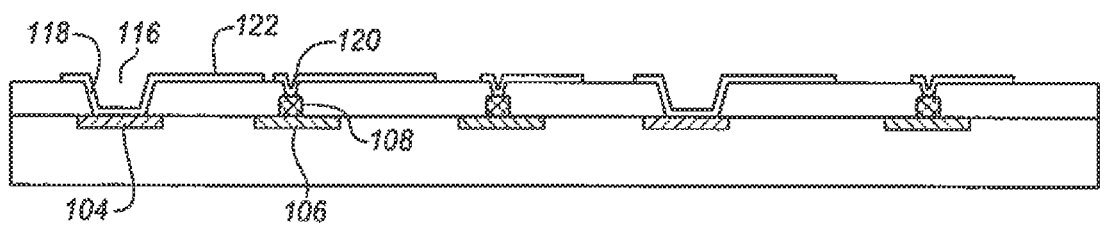
FIG. 3 is a cross-sectional side view diagram of the portion of the die of FIG. 2 with formed vias according to an embodiment.

FIG. 3 is a cross-sectional side view diagram of the portion of the die of FIG. 2 after vias have been formed. The vias may be formed in any manner desired. As an example, the dielectric material may be a photostructurable material. Some photostructurable materials take the form of photosensitive polymer dielectric materials, such as epoxies, polyimides, benzocyclobutene, or polybenzoxasole, etc. This dielectric material acts like a photoresist to form openings but is not removed after the via openings are formed and electroplated. Via openings over the connection pads 104, 106 can be generated by photolithography. Usually a good via definition can only be achieved up to a certain aspect ratio (ratio of height to diameter) of the vias. For any given dielectric layer depth, the aspect ratio will require a minimum via diameter. The particular maximum aspect ratio depends upon the material used and the processes for forming openings and filling or plating the openings.

As shown, the wide connection pads 104 allow for a deep via 116 that extends from the top of the dielectric to the pad at the bottom of the dielectric. On the other hand the openings for the smaller pads 106 are not wide enough to allow the via 120 to reach down to the bottom of the dielectric Because of the posts, the narrower via need only reach down to the post to connect to the smaller pads. As a result, the aspect ratios of large and small vias may be approximately equal. The aspect ratios may also be very different provided that each via is wide or large enough to reach the desired depth.

After the vias have been formed, conductive wiring layers 122 are formed over the dielectric and the vias to make any desired connections between vias and pads. Additional dielectric and wiring layers may be formed to form a multi-layer redistribution layer and any other desired structures. The wiring layers may be connected by shallow vias through each dielectric layer as desired. Connections between layers within a multi-layer RDL stack may also consist of a post with a via as described for the connections to the chip. The conductive material filling the holes may be the same material that makes up the layers of the RDL and it may be applied in the same way that the posts were formed. Alternatively, the posts, the conductive layers and the vias may be generated by any of a variety of different processes which may be the same or different from each other. In some embodiments, a seed layer is deposited over the die. A photoresist layer is deposited over the seed layer and then patterned by exposure and etching. The openings in the photoresist are electroplated and then the photoresist and seed layer are etched away.

Figure 4:
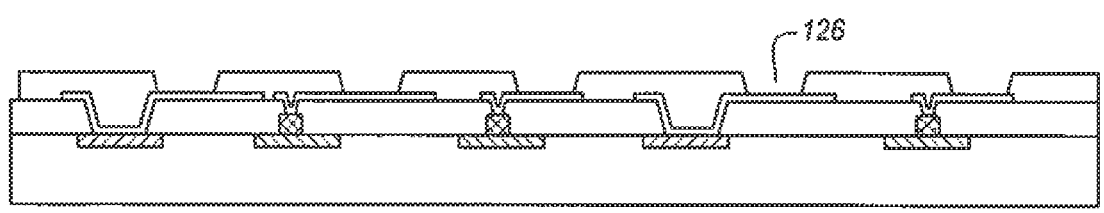
FIG. 4 is a cross-sectional side view diagram of the portion of the die of FIG. 3 with a patterned solder stop layer applied according to an embodiment.
Figure 5:
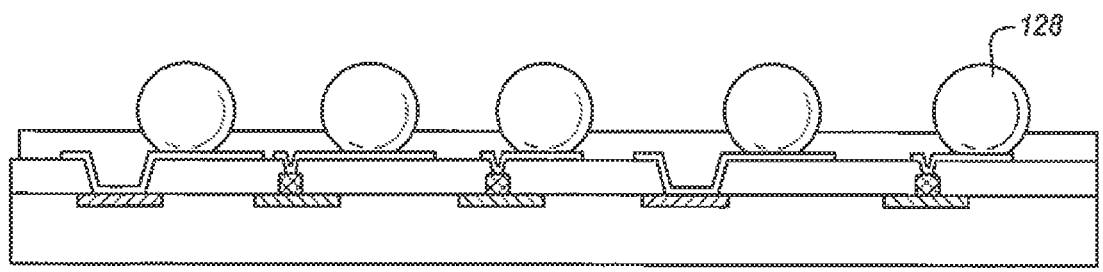
FIG. 5 is a cross-sectional side view diagram of the portion of the die of FIG. 4 with solder balls applied according to an embodiment.

FIG. 4 is a cross-sectional side view diagram of the portion of the die of FIG. 3 after the redistribution layer is formed. A solder stop layer 124 is formed over the die and patterned to create openings 126 exposing pads in the redistribution layer. In FIG. 5 solder balls are deposited in these openings and attached to the exposed RDL pads. The dies may each be diced from the wafer or singulated and any additional processing or finishing may be applied to finish each die.

Figure 6:
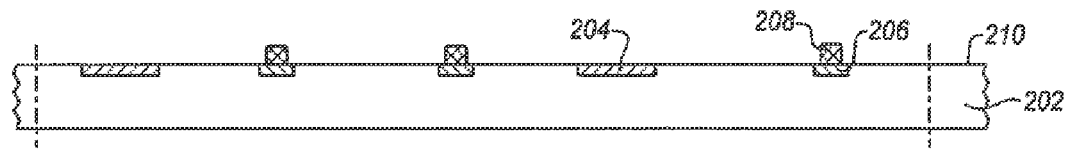
FIG. 6 is a cross-sectional side view diagram of a portion of another die with large pads and small pads with posts according to an embodiment.

FIG. 6 is a cross-sectional diagram of a portion of a die on a wafer similar to the die of FIG. 1. In this example, an eWLB (embedded wafer level ball grid array) process is shown. In an eWLB process, the dies are first singulated and then embedded in a mold carrier. The RDL is applied to the dies and the surrounding mold compound area. Then the packages made up of dies and surrounding mold compound are separated from each other by sawing the reconstituted wafer. This is shown in the next set of figures. The RDL for an eWLB package may benefit from the conductive post technique in the same way as shown above with respect to the WLB package.

In FIG. 6 a portion of a die 202 is shown fabricated on a silicon substrate (not shown). The die has internal circuitry formed on its front side 210 similar to that of FIG. 1. The circuitry is fitted with external connection pads some of which 204 are wide or large in diameter and some of which 206 are narrow or smaller in diameter. As in every illustrated example, the die pads are discussed as round but may take any suitable shape, depending on the type of circuit and RDL design to be used. A post 208 is formed over the small pads.

The post is shown as having a size only a little smaller than the pad, however, the post may be smaller or larger than the pad. The post may have a circular cross section like the pad or any other suitable cross section. The post as shown has about half the height of the dielectric layer. However the height of the post may be adapted to suit any particular design. It is limited by the maximum aspect ratio of openings in the plating resist. In the described examples, the posts and the vias are formed with a similar aspect ratio, however, this is not required. As shown in the examples of the figures, the post is about the same height as the via. This allows the conductive path of the post and the via to be formed with twice the aspect ratio of either the post or the via alone. In other words, in these examples, the final conductive path including the post is half the width or twice as high or long as the fabrication processes for the via alone would allow. The sizes of the posts, the openings and other aspects of the structure may be modified to obtain different aspect ration and different amounts of post relative to the overall via. Alternatively, for a longer path, a plating resist capable of a higher aspect ratios may be used. Posts may also be stacked i.e. a second post may be formed over the first post. This may be done before the first photoresist is removed.

Figure 7:
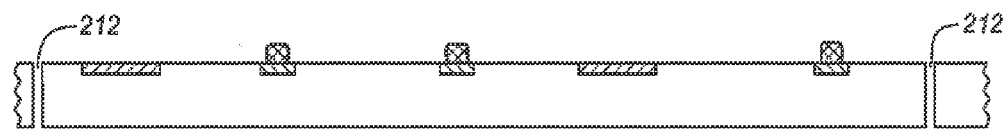
FIG. 7 is a cross-sectional side view diagram of the portion of the die of FIG. 6 being diced according to an embodiment.

FIG. 7 is a cross sectional diagram of the portion of the die of FIG. 6 in which the wafer has been sawed. The wafer is diced by sawing or in any other desired way to form many small dies from the one wafer. This is indicated by saw kerf lines 212.

Figure 8:
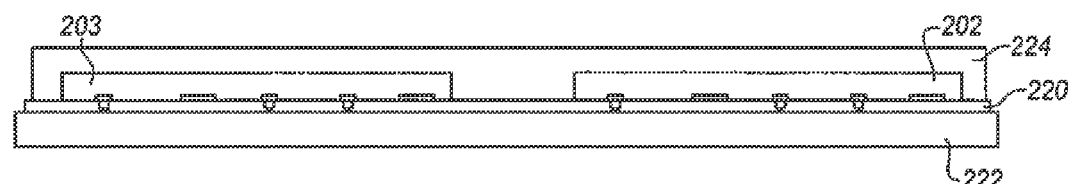
FIG. 8 is a cross-sectional side view diagram of the portion of the die of FIG. 7 embedded in a reconstituted wafer attached to a temporary carrier according to an embodiment.

FIG. 8 is a cross sectional side view diagram of two singulated dies 202, 203. These have been pressed into a release tape 220 with the front side 210 in contact with the tape. The release tape has been attached to a temporary carrier 222 to carry the dies and maintain their relative position to each other. The posts are pressed into the release tape, but the posts are not so long as to interfere with the adhesion or position of the dies on the tape. The dies once held into position on the tape are covered in a mold compound 224. In this example, the mold compound covers the dies and is also between the dies to securely hold the dies in position.

Figure 9:
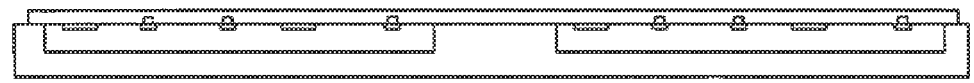
FIG. 9 is a cross-sectional side view diagram of the portion of the reconstituted wafer of FIG. 8 with a dielectric layer applied according to an embodiment.

FIG. 9 is a cross sectional side view of the die of FIG. 6 after the mold compound has cured. The release tape 220 is released and the temporary carrier 222 is removed. The dies are held in place by the mold compound. While only one die 202 is shown there may be many more dies being processed simultaneously. Similar to the process of FIG. 2 a dielectric layer 226 is applied over the exposed front side 210 of the dies, and the surrounding mold compound surface.

Figure 10:
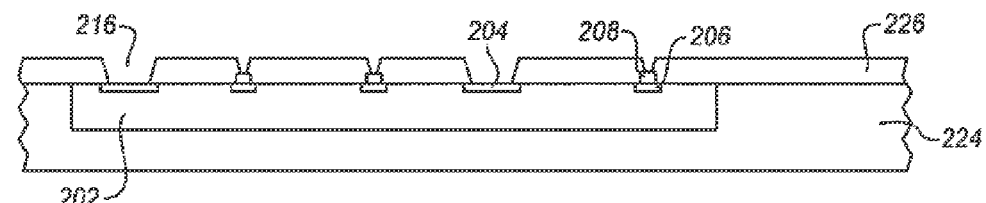
FIG. 10 is a cross-sectional side view diagram of the portion of the reconstituted wafer of FIG. 9 with a formed vias according to an embodiment.

FIG. 10 is a cross sectional side view of the die of FIG. 9 after openings have been formed by lithography in the photostructurable dielectric as described herein. Alternatively, the openings may be formed in any other desired way.

After the openings are formed in the dielectric, the dielectric may be processed in the same way as described above. The RDL is deposited and, in the same step, the vias are filled Many more layers of RDL may be formed, depending on the particular implementation. A structured solder stop layer is deposited and patterned as in FIG. 4 to form a solder ball grid as in FIG. 5. The dies are then separated from each other by sawing or cutting through the RDL and mold compound to obtain individual die packages.

The posts described herein have been shown above as applied to a fan-in Wafer Level package in FIG. 1 and also to a fan-out Wafer Level package, for example an eWLB package in FIG. 6. In the case of an eWLB-package posts may be applied on the silicon wafer before dicing or on the reconstituted wafer in a first step of the RDL fabrication process. When the posts are applied on the silicon wafer, the relative positions of the pads are controlled much more accurately than on the reconstituted wafer. Accurate post positioning is important to aligne the vias and to allow smaller diameter pads on the die surface.

In FIG. 8, when the dies are singulated and encapsulated, also referred to as reconstitution, the dies may shift in position. In this die shift, the die moves away from its nominal position in the original silicon wafer to a different position in the reconstituted mold compound wafer. This may cause issues with accurately positioning a post on a pad. Accuracy is particularly important with small pads and when the pads are close together. After the posts are applied on a silicon wafer level, prior to singulation for the reconstitution, the dies may then be picked and placed on the adhesive on the mold carrier. The posts are embedded in the adhesive of the tape and are therefore not negatively affected by the process.

Figure 11:
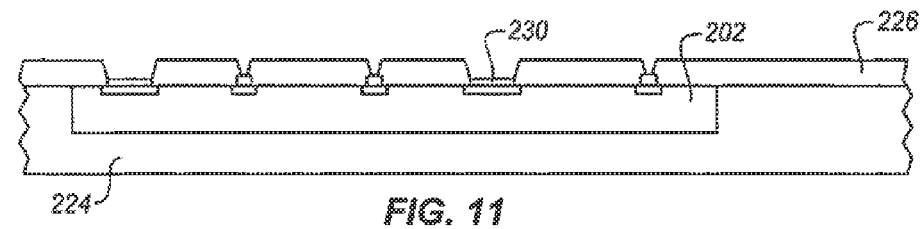
FIG. 11 is a cross-sectional side view diagram of a die in a reconstituted wafer with a protective layer over the pads according to an embodiment.

FIG. 11 shows how another technique for forming the via openings may be accommodated. FIG. 11 is a cross sectional side view diagram of the die 202 encapsulated in the mold compound 224. The dielectric layer 226 has been applied. However, before the dielectric layer is applied, each connection pad is plated with a protective material 230. The protective material protects the pads while the openings are being formed. As an example laser ablation may be used to form the openings, however, the thin pads may be damaged. A layer of protective material will provide an extra sacrificial shield against the laser while the dielectric is being ablated.

The protective material may be applied at the same time as forming the posts as in FIGS. 1 and 6. The material may be the same material as the posts, such as copper. This allows the protective material to be formed without adding an additional process step. The posts on the wider pads will normally have less height due dot the higher current density at the smaller pads during electroplating. While the shorter posts on the wider pads may not be necessary for forming the vias, they also do not harm the process and may provide a better electrical connection between the pads and the vias.

As shown, with a panel-based or other similar technology, a laser may be used to open the vias. In this case, the large via pads may also be covered with a post. The posts protect the chip pads from laser ablation i.e. they act as a stop for the via opening process by laser. The height of these large posts may be less than for the posts of small via pads.

The release of the posts, in which the top sides of the posts are made accessible to a redistribution layer or other electrical connection, may be done in any of a variety of different ways. In some embodiments, a full field removal of the dielectric is applied over the entire surface of the die or wafer until the posts are exposed. This removal may be by plasma etching, grinding, cutting (e.g. with diamond blade, fly cut) etc. These removal processes may be less expensive than laser and photolithography processes for opening up the vias.

In other embodiments, film assisted molding may be used. In this embodiment a mold compound is used as a dielectric covering the front side of the die with the posts. It can be applied as a sheet, in liquid form, or in granular form.

Figure 12:
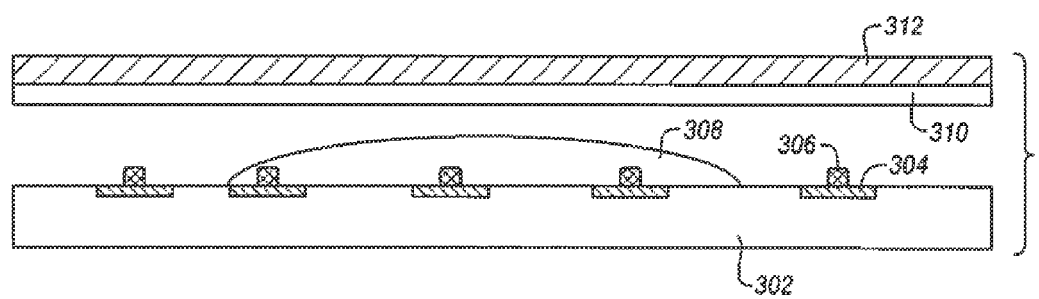
FIG. 12 is a cross-sectional side view diagram on a die with posts and a mold chase according to an embodiment.

FIG. 12 is a cross-sectional side view diagram of applying posts to the top of a die to build vias using a mold compound. A die with integrated circuits or other structures has been formed on a silicon substrate 302. The circuits or other structures have external connections through multiple conductive pads 304. These pads may have different sizes and be arranged in order to facilitate the connections. For at least some of the pads, posts 306 have been installed over the pads. In addition, a mold compound 308 has been applied over the die. In this example, the mold compound is a liquid that will be spread over the die, however, other forms may be used instead. A top mold chase 312 is covered with a soft film 310 facing the die.

Figure 13:
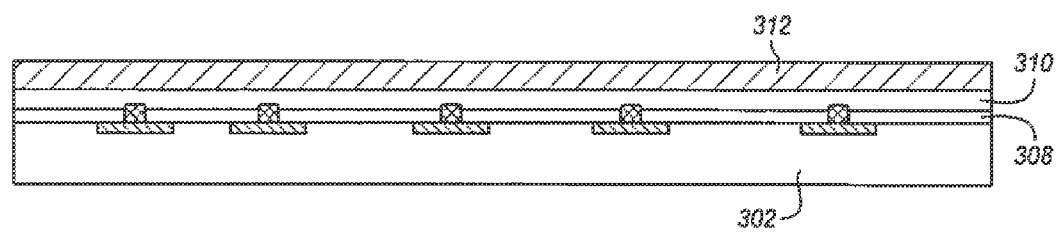
FIG. 13 is a cross-sectional side view diagram of the die of FIG. 12 after a mold tool has closed over the die according to an embodiment.

FIG. 13 is a side cross-sectional view of the die and mold chase of FIG. 12 after the mold chase is closed over the mold compound, the posts, and the top of the die. As a result, the posts are pressed upward through the mold compound into the film 310 as the film is pressed downward.

Figure 14:
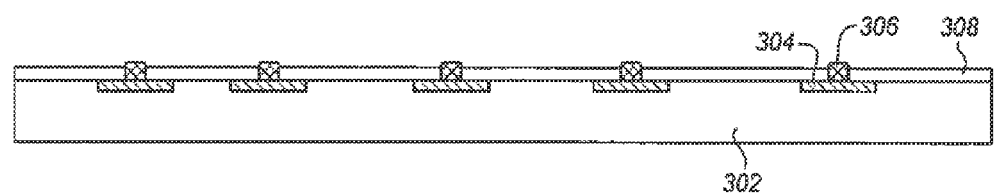
FIG. 14 is a cross-sectional side view diagram of the die of FIG. 13 after removing the mold tool and a film according to an embodiment.

FIG. 14 is a side cross-sectional view of the die with the mold tool removed. After opening the mold chase 312 and removing the film 310, the posts are already exposed above the mold compound. This occurs in part because the posts were pressed into the film as shown in FIG. 13. When the film is removed, the posts are exposed. Accordingly, there is no need for a separate via opening step as shown, for example, in FIG. 9.

The processing of the die may then be continued with generation of a redistribution layer and with the other operations described above for the other die types. The redistribution layer may be fabricated as an example by sputtering a seed layer, applying and patterning a plating resist, electroplating conductive redistribution lines, stripping the resist, and etching the seed layer. This may be repeated multiple times to build as many wiring layers as desired. The wiring layers may be connected by short vias.

While the examples described herein relate to WLB packages, similar techniques may be used for a variety of other types of die and packaging technologies. Posts may be formed over die contacts on a wafer level or a die level regardless of wafer or die type and then a thick dielectric may be formed over the contacts and the posts as described herein so that vias may be formed that are only as deep as necessary to reach the posts.

Figure 15:
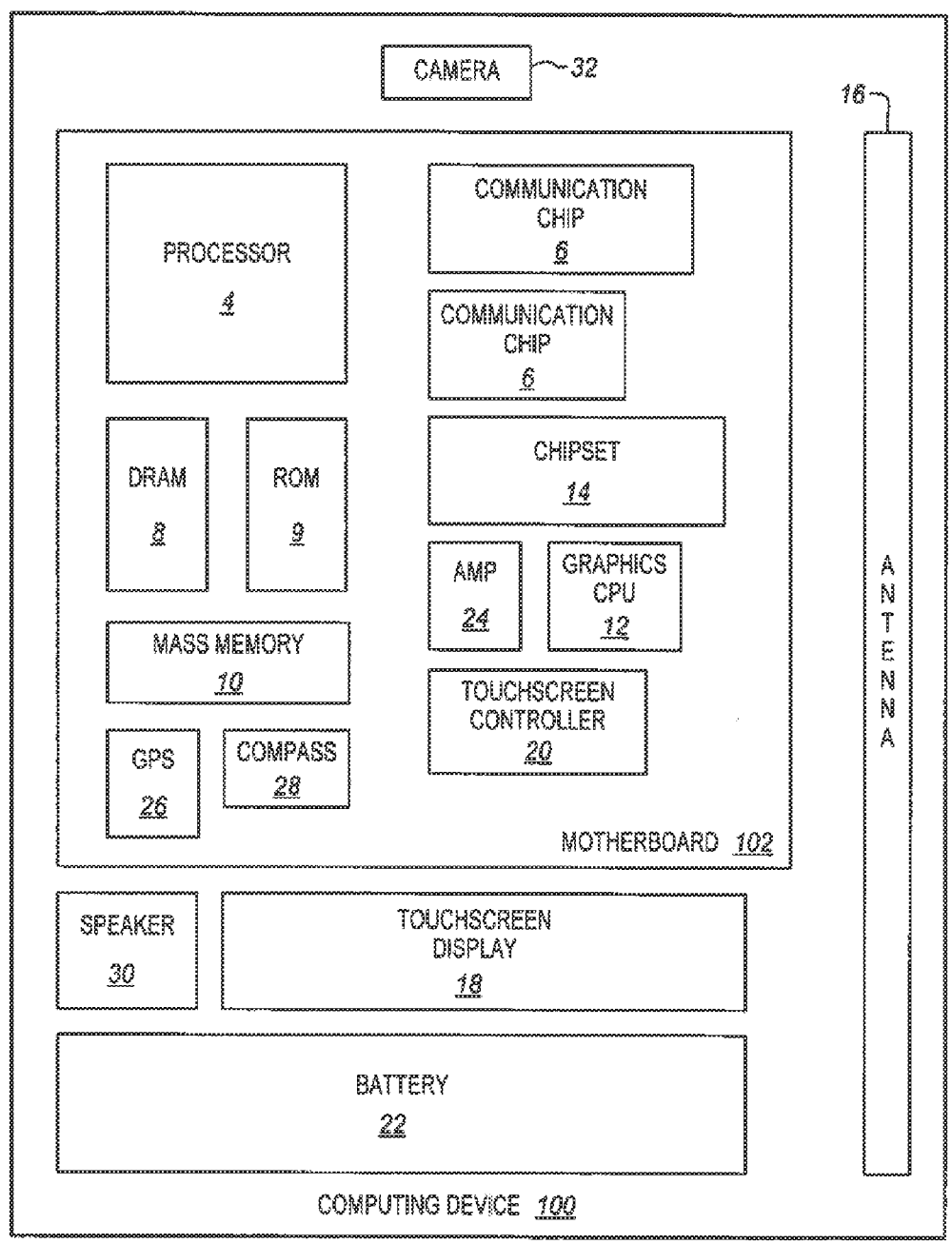
FIG. 15 is a block diagram of a computing device incorporating a packaged die according to an embodiment.

FIG. 15 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2. At least one antenna 16 is integrated with a communication package 6 and is physically and electrically coupled to the board 2 through the package. In some implementations, any one or more of the components, controllers, hubs, or interfaces are formed on dies using through silicon vias as described above.

Depending on its applications, computing device 100 may include other components that may or may not be physically and electrically coupled to the board 2. These other components include, but are not limited to volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth. These components may be connected to the system board 2, mounted to the system board, or combined with any of the other components.

Any one or more of these components may be implemented as packaged semiconductor dies as described herein. Components that are shown here may be combined into a single integrated circuit die or may be combined into a single package. Other components may be implemented as multiple dies in one or more packages. The packages may connect directly to each other or through the system board.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 100 may be a wearable device, such as a watch, glasses, headset or fitness device, a node for the Internet of Things or any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with or combined with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method that includes forming a plurality of conductive connection pads on a semiconductor substrate to connect to circuitry formed on the substrate, forming a post on each of a subset of the connection pads, the posts being formed of a conductive material, forming a dielectric layer over the semiconductor substrate including over the connection pads and the posts, forming holes by removing the dielectric layer directly over the posts, filling the formed holes with a conductive material, and forming a connector over each filled hole.

In further embodiments the posts extend from the substrate to a height of about one half of the dielectric layer.

In further embodiments the posts and the formed holes have a cross-sectional surface area and the posts have a larger cross-sectional surface area than the holes.

In further embodiments the conductive material of the posts and the conductive material of filling the holes is the same conductive material.

In further embodiments the conductive material is copper.

In further embodiments forming a plurality of conductive connection pads comprises forming the first subset of the connection pads having a first diameter and a second subset of the connection pads having a second larger diameter and wherein forming a post comprises forming a post only on the pads of the first subset of connection pads.

In further embodiments forming holes comprise forming holes using a patterned photoresist and etching the dielectric layer over the conductive connection pads.

In further embodiments forming holes comprises using a photostructurable dielectric, exposing a portion of the dielectric over the conductive connection pads and removing the unexposed dielectric.

In further embodiments filling the formed holes comprises electroplating copper into the holes.

In further embodiments forming a plurality of conductive connection pads comprises forming the first subset of the connection pads having a first diameter and a second subset of the connection pads having a second larger diameter and wherein forming a post comprises forming a post on the pads of the first subset and the second subset of connection pads and wherein forming holes comprises forming holes by laser ablation.

Further embodiments include dicing the semiconductor substrate after forming the posts to form a plurality of dies, and embedding at least a portion of the plurality of dies in a mold compound with the posts exposed, and wherein forming a dielectric layer is performed after embedding.

In further embodiments embedding further comprises placing the at least a portion of the dies on a tape so that the posts are embedded in the tape, the tape being attached to a temporary carrier, applying the mold compound over the dies and the temporary carrier and removing the tape and the temporary carrier to expose the posts.

Further embodiments include forming a redistribution layer over the dielectric layer while filling the holes and wherein forming a connector comprises forming a solder ball array.

In further embodiments forming holes comprises sputter a seed layer over the dielectric, depositing and patterning a photoresist over the seed layer, and wherein filing the holes comprises electroplating over openings in the patterned photoresist, stripping the photoresist and etching the seed layer In further embodiments forming holes comprises reducing the height of the dielectric to expose the posts over the posts and also over the entire substrate.

In further embodiments reducing comprises applying a process selected from the set of grinding, polishing, cutting, and etching.

In further embodiments forming a post comprises applying a protective layer over each of the subset of connection pads, applying a seed layer over the semiconductor substrate, patterning a photoresist over the semiconductor substrate with openings over the subset of connection pads, electroplating the openings with a conductive material to form the posts, and removing the patterned photoresist.

Some embodiments pertain to a semiconductor device package that includes a plurality of conductive connection pads on a semiconductor substrate to connect to circuitry formed on the substrate, a post on each of a subset of the connection pads, the posts being formed of a conductive material, a dielectric layer over the semiconductor substrate including over the connection pads and the posts, filled vias over each connection pad that is not of the subset and over each post of the subset of the connection pads, and a connector over each filled via.

In further embodiments the posts extend from the substrate to a height of about one half of the dielectric layer.

In further embodiments the posts and the formed holes have a cross-sectional surface area and the posts have a larger cross-sectional surface area than the holes.

In further embodiments the conductive material of the posts and the vias is the same conductive material.

In further embodiments the first subset of the connection pads have a first diameter and a second subset of the connection pads have a second larger diameter and the posts are only on the pads of the first subset of connection pads.

Further embodiments include a redistribution layer over the dielectric layer and wherein the connectors comprise a solder ball array.

Some embodiments pertain to a system that includes a system board, a memory connected to the system board, and a processor connected to the system board and coupled to the memory through the system board, the processor having a semiconductor die having a plurality of conductive connection pads on a semiconductor substrate to connect to circuitry formed on the substrate, a post on each of a subset of the connection pads, the posts being formed of a conductive material, a dielectric layer over the semiconductor substrate including over the connection pads and the posts, filled vias over each connection pad that is not of the subset and over each post of the subset of the connection pads, and a connector over each filled via.

In further embodiments the posts extend from the substrate to a height of about one half of the dielectric layer.

In further embodiments the first subset of the connection pads have a first diameter and a second subset of the connection pads have a second larger diameter and the posts are only on the pads of the first subset of connection pads.

What is claimed is:

1. A method comprising:
   forming a plurality of conductive connection pads on a semiconductor substrate to connect to circuitry formed on the substrate;
   forming a post on at least one of the connection pads, the post being formed of a. conductive material;
   forming a dielectric layer over the semiconductor substrate including over the connection pads and the post;
   forming a hole by removing the dielectric layer directly over the post to expose the post with dielectric remaining between at least some the conductive pads;
   filling the formed hole with a conductive material to electrically contact the post; and
   forming a connector over the filled hole with dielectric remaining between at least some of the conductive connection pads.

2. The method of claim 1, wherein the post extends from the substrate to a height of about one half of the dielectric layer.

3. The method of claim 1, wherein the post and the formed hole have a cross-sectional surface area and the post has a larger cross-sectional surface area than the hole.

4. The method of claim 1, wherein the conductive material of the post and the conductive material of filling the hole is the same conductive material.

5. The method of claim 1, wherein the conductive material is copper.

6. The method of claim 1, wherein forming a plurality of conductive connection pads comprises forming a first subset of the connection pads having a first diameter and a second subset of the connection pads having a second larger diameter and wherein forming a post comprises forming a post only on the pads of the first subset of connection pads.

7. The method of claim 6, wherein forming holes comprise forming holes using a patterned photoresist and etching the dielectric layer over the conductive connection pads.

8. The method of claim 6, wherein forming holes comprises using. photostructurable dielectric, exposing a portion of the dielectric over the conductive connection pads and removing the unexposed dielectric.

9. The method of claim 1, wherein forming a plurality of conductive connection pads comprises funning a first subset of the connection pads having a first diameter and a second subset of the connection pads having a second larger diameter and wherein forming a post comprises forming a post on the pads of the first subset and the second subset of connection pads and wherein forming holes comprises forming holes by laser ablation.

10. The method of claim 1, further comprising:
    dicing the semiconductor substrate after forming the post to form a plurality of dies; and
    embedding at least a portion of the plurality of dies in a mold compound with the post exposed, and
    wherein forming a dielectric: layer is performed after embedding.

11. The method of claim 10, wherein embedding further comprises:
    placing the at least a portion of the dies on a tape so that the post is embedded in the tape, the tape being attached to a temporary carrier;
    applying the mold compound over the dies and the temporary carrier; and
    removing the tape and the temporary carrier to expose the post.

12. The method of claim 1, further comprising forming a redistribution layer over the dielectric layer while filling the hole and wherein forming a connector comprises forming a solder ball array.

13. The method of claim 1, wherein forming a hole comprises reducing the height of the dielectric to expose the post over the post and also over the entire substrate.

14. The method of claim 1, wherein forming a post comprises:
    applying a protective layer over each of a subset of the connection pads;
    applying a seed layer over the semiconductor substrate;
    patterning a photoresist over the semiconductor substrate with openings over the subset of connection pads;
    electroplating the openings with a conductive material to form the posts; and removing the patterned photoresist.

15. The method of claim 1, wherein forming a hole comprises reducing the height of the dielectric to expose the post over the post and also over the entire substrate.

16. The method of claim 15, wherein reducing comprises applying a process selected from the set of grinding, polishing, cutting, and etching.

17. The method of claim 1, wherein forming a hole comprises sputtering a seed layer over the dielectric, depositing and patterning a photoresist over the seed layer, and wherein filing the hole comprises electroplating over the opening in the patterned photoresist, stripping the photoresist and etching the seed layer.

* * * * *

UNITED STATES PATENT AND TRADEMARK OFFICE
CERTIFICATE OF CORRECTION

PATENT NO. : 9,576,918 B2  
APPLICATION NO. : 14/717169  
DATED : February 21, 2017  
INVENTOR(S) : Meyer et al.

Page 1 of 1

It is certified that error appears in the above-identified patent and that said Letters Patent is hereby corrected as shown below:

In the Claims

In Column 11, at Line 56, Claim 1 after "conductive", insert --connection--.

In Column 12, at Line 20, Claim 9 delete "funning" and insert --forming--.

Signed and Sealed this
Ninth Day of May, 2017

Michelle K. Lee
*Director of the United States Patent and Trademark Office*